US008976825B1

(12) United States Patent
Redpath et al.

(10) Patent No.: US 8,976,825 B1
(45) Date of Patent: Mar. 10, 2015

(54) HEAT SINK MOUNT FOR LASER DIODE

(71) Applicants: Richard Redpath, Cary, NC (US); James Redpath, Cary, NC (US)

(72) Inventors: Richard Redpath, Cary, NC (US); James Redpath, Cary, NC (US)

( * ) Notice: Subject to any disclaimer, the term of this patent is extended or adjusted under 35 U.S.C. 154(b) by 0 days.

(21) Appl. No.: 14/153,689

(22) Filed: Jan. 13, 2014

(51) Int. Cl.
*H01S 3/04* (2006.01)
*H01S 5/024* (2006.01)

(52) U.S. Cl.
CPC .................................. *H01S 5/02469* (2013.01)
USPC .............. 372/36; 372/33; 372/34; 372/43.01; 372/50.1

(58) Field of Classification Search
USPC ...................................... 372/33–34, 36, 43.01
See application file for complete search history.

(56) References Cited

U.S. PATENT DOCUMENTS

| 2003/0214987 A1* | 11/2003 | Yamanaka et al. | 372/43 |
| 2007/0147449 A1* | 6/2007 | Bessho et al. | 372/36 |
| 2009/0002663 A1* | 1/2009 | Freimann et al. | 355/67 |

* cited by examiner

*Primary Examiner* — Dung Nguyen
(74) *Attorney, Agent, or Firm* — Ming Chow; Sinorica, LLC

(57) ABSTRACT

A heat sink mount for a laser diode comprises three main components, a diode ring, a diode bed and a diode container. The diode ring comprises an inner hole that matches a metal stem part of the laser diode. The diode bed comprises a first part and a second part. The diode ring is fitted into the first part of the diode bed. The inner surface of the first part is tightly contacting the outer surface of the diode ring. The diode container comprises a part a and a part b. The diode bed is fitted into the part a of the diode container, via the gripping contact between the thread on the inner surface of the part a and the thread on the outer surface of the second part of diode bed. This heat sink mount has lower costs and higher heat dissipation efficiency.

20 Claims, 6 Drawing Sheets

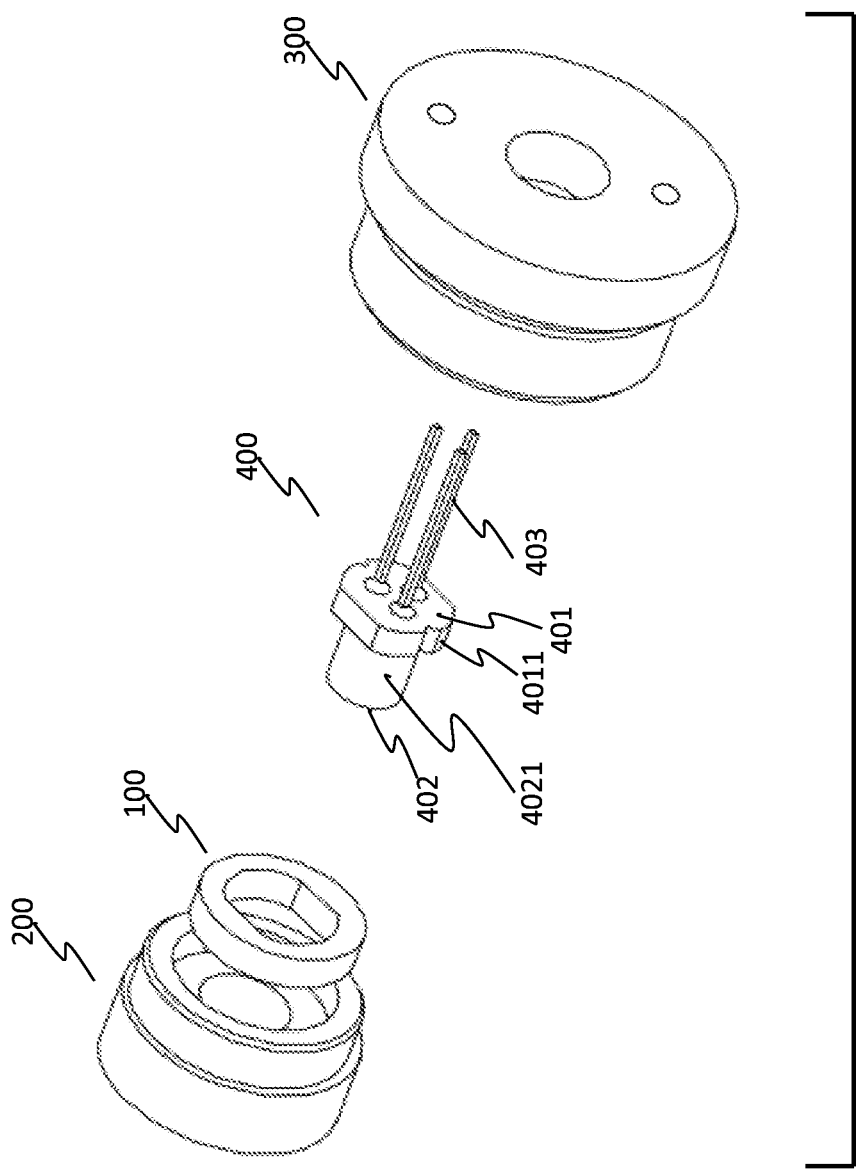

HEAT SINK MOUNT FOR LASER DIODE

FIELD OF THE INVENTION

The present invention relates generally to heat dissipation apparatus. More specifically, relates to a heat sink mount for laser diode, which does not need screws or glue.

BACKGROUND OF THE INVENTION

Laser (Light Amplification by Stimulated Emission of Radiation), invented almost sixty year ago, has found its applications in a wide variety of different areas, such as scientific research, medical application, military, industrial and commercial and people's everyday life. It has been used in spectroscopy, ranging and sensing devices, microscope, bar code reading, targeting, cosmetic surgery, cutting, welding, computer mouse and so on.

In these applications, different types of laser have been generated through different approaches, by different apparatuses. Up to date, laser comprises the following major types, gas lasers, solid state lasers, metal vapor laser, semiconductor laser and so on. Among these laser types, laser diode is not just the main family of semiconductor laser, but also, in quantity, the most common one among any types of laser currently available. The laser diode has found wide applications in many industrial areas and people's everyday life. In telecommunication, as it is easily modulated and easily coupled light sources for fiber optics communication. It is used in various measuring instruments, such as rangefinders. Other common uses include barcode readers, scanning and laser printer, as well as night light and emergency light. Most of them are common products in people's daily life. In comparison to other types of laser, the low cost of mass-produced diode lasers makes them essential for those mass-market applications. Today laser diodes are available with power outputs ranging from a few milliwatts, like those found in laser pointers, to laser diodes emitting many watts of optical energy and are used to cut through solid metal and in high energy physics experiments.

In most of the applications, the laser is not used in a standing alone manner. Instead, it is always mounted to some adaptors or connectors that further link the laser diode to the devices that are using it. In most of the cases, the mounting adaptor is a heat sink that helps to dissipate the heat generated from the laser diode. Albeit itself does not generate any laser, the heat sink mount is actually critical for a laser diode's function. It significantly influences many key aspects of a laser diode. Laser diode is a semiconductor, which can only functions appropriately within a very narrow temperature range. Heat dissipation is thus always a key issue for any semiconductor and device containing semiconductor in it, such as a computer. Without efficient heat dissipation, the heat generated will make a semiconductor component, as well as the entire device, quickly fail. In this regard, a heat sink is the key for a laser diode's properly functioning and its reliability.

In addition, a heat sink mount is particularly important for a laser diode. That's because a laser diode is not a normal semiconductor, but a specific semiconductor that can generate laser. In this concern, like many other types of laser generating devices, it comprises a mirror or reflecting plane as a basic component. In a laser diode, this has been achieved by cleaving the semiconductor wafer to form a spectacularly reflecting plane. It is the easiest way to make such a micro reflecting device within a semiconductor. However, the atomic states at the cleavage plane have actually been altered. As a result, when the generated laser light is propagated via this cleavage plane to the outside of the semiconductor crystal structure, a portion of the light will be absorbed by the surface state of this cleavage plane and via the interaction between the photon and electron, it will be eventually converted into heat. In light of the foregoing, the proper function of such heat sink is particularly important. If it can not quickly and efficiently transfer such heat to outside, the entire laser diode will fail soon.

What's even worse, in the foregoing scenario, if the heat can not be quickly dissipated via its heat sink mount, the accumulated heat will heat the cleavage plane to a higher temperature, which further leads to shrink of the bandbag in the cleavage area, such shrink functions to align the electronic transition and the photon energy; as a result, such alignment leads to more absorption. Clearly, this is a positive feedback loop. Eventually, in a worse scenario, the entire cleavage surface would be melt down; and thus the whole laser diode has to be scrapped.

In addition to the aforementioned issues, the function of a laser diode is highly correlated to its temperature, too. In general, the wavelength of generated laser typically would alter by 0.9 nm for every 3.0 degrees Celsius. On the other hand, as the temperature of a laser diode increases, the optical power output will drop.

Accordingly, a heat sink is truly critical for a laser diode's proper function and its reliability. In order to remove as much heat as possible from a laser diode, the contact between the heat mount and the laser diode is the key. It needs to match a laser diode's shape and perfectly contact the surface of the laser diode. The larger the contact area, the better the heat dissipation effect is. It also needs to avoid any air within the heat sink, between the heat sink and the laser diode, as air is one of the poorest among the common materials for heat transfer. Accordingly, any air staying in between the heat sink mount and the laser diode would compromise the heat dissipation effect.

In order to achieve the best heat dissipation effect from a heat sink mount, the contact surface of the laser diode and the heat sink mount needs to be optimized; besides, the fastening means between different components of the heat sink is also very important. If glue has been used for such purpose, it should be make sure that such glue functions properly at a high temperature, as the heat sink mount could be pretty hot after absorbing heat energy from the laser diode. On the other hand, it should also be make sure that such glue not evaporates any toxic substance at a high temperature, since the laser diode are applied in many devices in people's everyday life, or even used directly on human body, such as in a cosmetic or dental surgery. In addition, it has to be careful with glue as glue may act as insulation and thus compromise the heat sinking ability.

Furthermore, as mentioned above, the heat sink mount and the laser diode are always made into an assembled one piece in the device, for the purpose of heat dissipation, as well as mechanical protection and connection of the tiny laser diode. So, in a sense, the laser diode and its heat sink mount would be treated as one piece. Considering its specific structural design, manufacturing equipments and raw materials used for manufacture, the costs for manufacturing the laser diode part do not have a large room for price drop currently. However, due to its relatively simple structure and commonly used raw material, the costs from the part of heat sink mount can actually be further reduced. In fact, a significant part of such cost is derived from assembling the heat sink pieces together, as well as mounting a laser diode into the heat sink. Through redesign the heat sink components, assistant assembling tools, and streamlining the assembling process, the assembly cost could be reduced and the production efficiency could be improved, which would reduce labor costs to increase production rate per day.

It is therefore an objective of the present invention to provide a new type of heat sink mount for laser diode. Such heat sink mount is easy to assemble, of a low defective rate and at the same time, provide a better heat dissipation effects.

BRIEF DESCRIPTION OF THE DRAWINGS

FIG. 6 illustrates the heat sink mount with its three components along with a laser diode.

DETAILED DESCRIPTION OF THE INVENTION

All illustrations of the drawings and description of embodiments are for the purpose of describing selected versions of the present invention and are not intended to limit the scope of the present invention.

The present invention is a heat sink mount for laser diode. In comparison to other typed of heat sink for laser diode, it has a simple structure, with three components forming the heat sink mount. It uses threads to combine different pieces of the heat sink mount together, with no need of any glue or screw or micro screw to fasten different components together. In addition, its shape and surface have been specifically designed to ensure that its inner side surface has a perfect match to the outer side surface of a laser diode, thus the air pocket existing between the heat sink mount and the laser diode has been minimized. It also has enabled a specifically designed tool to facilitate the assembling of the heat mount and the laser diode.

Furthermore, although tightly contacts the laser diode, the heat sink mount of the present invention can be easily disassembled from the laser diode. This is pretty useful when the laser diode inside failed and thus need to be replaced with a new laser diode. Unlike the heat mount that uses glue for assembly and after the glue dried the laser diode and its heat sink become one piece that can not be easily disassembled; via an easy unscrewing step, the failed laser diode could be replaced conveniently in the present invention. This could save the heat sink mount, which would be otherwise scrapped along with the failed laser diode in it. The diode can be returned to the vender for a refund at production test time if failure is found at the factory. Laser diodes have a yield and the vender must have the diode back for a refund.

In reference to the accompanying drawings, the heat sink will be further described in details in an order from the center to the outside, along with the laser diode, although laser diode is not a part of the invention. The entire design is based on the specific properties of a laser diode, such as its particular shape and size.

Figure 1:
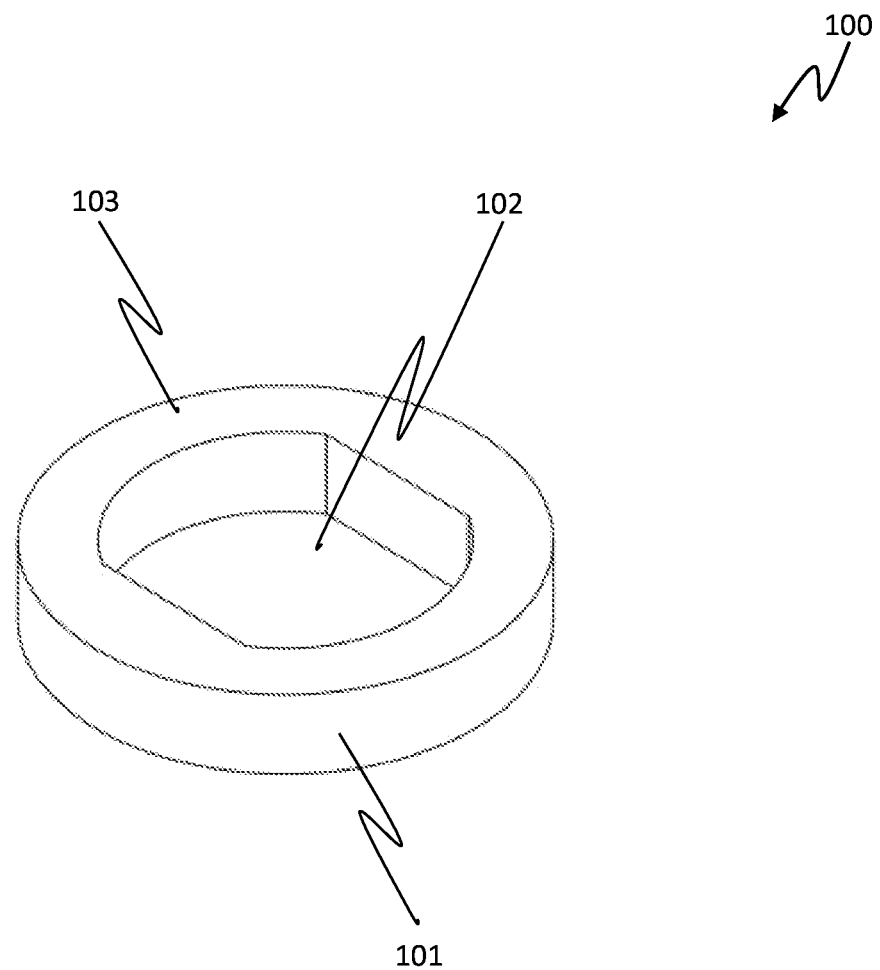
FIG. 1 is a view of the Diode ring of the heat sink mount of the present invention.

In reference to FIG. 1, from the center, the first component of the heat sink mount is a diode ring 100. It can be made of any suitable metal or other materials, which have a desired heat transfer coefficient. It is in a ring like shape. The outer side surface 101 has a cross section in a perfect circle shape. In regard to its inner hole (first inner hole) 102, it has a first inner side surface 103 and a cross section that is corresponding to the shape of the middle metal stem 401 of a laser diode 400 as shown in FIG. 6. In most cases, as shown in FIG. 6, the stem part has a cross section with a stadium shape, which may also be termed as a discorectangle shape. This shape has been defined as a geometric shape constructed of a rectangle with semi-circles at a pair of opposite sides. Accordingly, the outer side surface 4011 in FIG. 6 of the metal stem part of the laser diode will be in contact the inner side surface of the diode ring.

The conventional heat sink mounts for laser diode have both their outer side surface and inner side surface in circle shape. However, as mentioned previously, the protruding metal stem part of a laser diode is usually with a stadium shaped cross section. Accordingly, the round shaped inner side surface of the heat sink can not perfectly match the stadium shaped outer side surface of a laser diode's stem part. The laser diode in this case wants the heat sink mostly to contact the flat sides not the round area; so using a round hole is not very good. As a result, the effective contact area between the heat sink and the laser diode is very limited. In addition, there is quite a lot air in between the heat sink mount and the laser diode. Thus, the contact area that should be maximized in order to dissipate the heat is not maximized. The air between the heat sink mount and the laser diode, which should be minimized, is actually not minimized. As a result, such heat sink mount can not effectively transfer the heat from the laser diode to the outside, which may compromise the function of the laser diode in it, or even lead to laser diode premature failure.

In the present invention, the inner side surface has been specifically designed to be in a stadium shape. In this way, it can tightly contact the outer side surface of the stem section of a laser diode, thus optimize the contact area between the heat sink mount and the laser diode in it, at the same time, it reduces the air between them as much as possible. However, certain types or brands of laser diode may have their stem sections in different shapes, which as circle, square and etc. In order to address such issue, the inner hole of the diode ring of the present invention can be made in different shapes, so as to match the shape of the respective laser diode stem part. In regard to these diode rings with different inner holes, the only difference among them is the shape of their inner hole cross sections, which can be in any shape that matches the stem part of a laser diode. This ring is easy to punch mfg for different inner hole shapes instead of having a mold to pour into to make a shape which is quite difficult to meet tolerances. In otherworld, the cost is incredibly less and all you have to do is use a different ring, the rest of the parts remain the same.

In practical, this particular feature has brought in another potential benefit. When replacing a failed laser diode, if the heat sink mount disclosed in the present invention has been used, one has more options to choose a new laser diode, rather than being limited to the same product from the same manufacturer. In such a scenario, a person may choose to replace the failed one with an exactly same product from the same manufacturer, which should certainly fit the existing heat sink mount. Alternatively, he may choose a new product, if that type of diode is out of stock; or he could choose one from a different manufacturer, which may have a better quality or better price, but has a different diode (stem part) shape than the failed one. In this case, one only needs to replace a single component of the heat sink, i.e., the diode ring, to a different available shape, and keeps using all other existing heat sink parts. This would not only offer more options, increase efficiency, lower the parts and labor costs, but also reduce waste and help to protect the environment.

The diode ring of the present invention has a height that is the same as the height of the metal stem part of a laser diode. So, the diode ring can be easily assembled around the metal stem part of the laser diode. The ring has an outer side surface. The first inner hole and the diode ring are coaxial.

Figure 2:
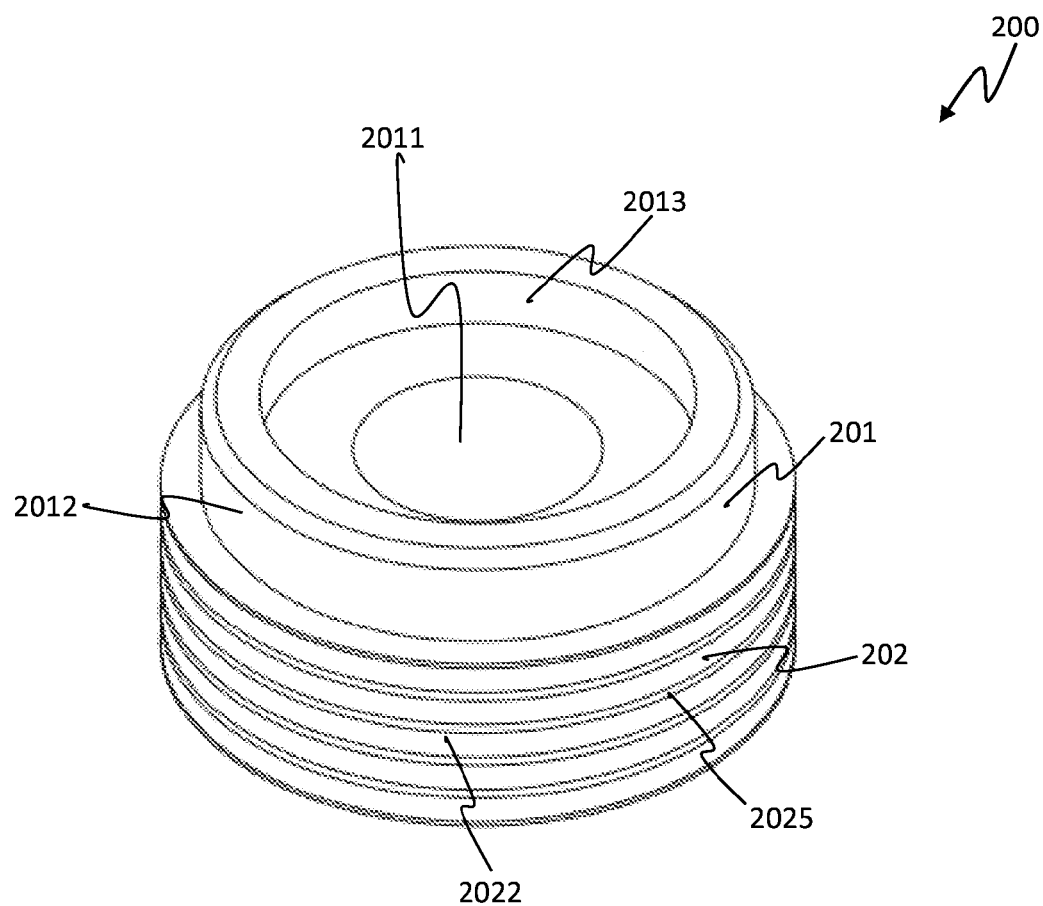
FIG. 2 is a top view of the Diode bed of the heat sink mount of the present invention.
Figure 3:
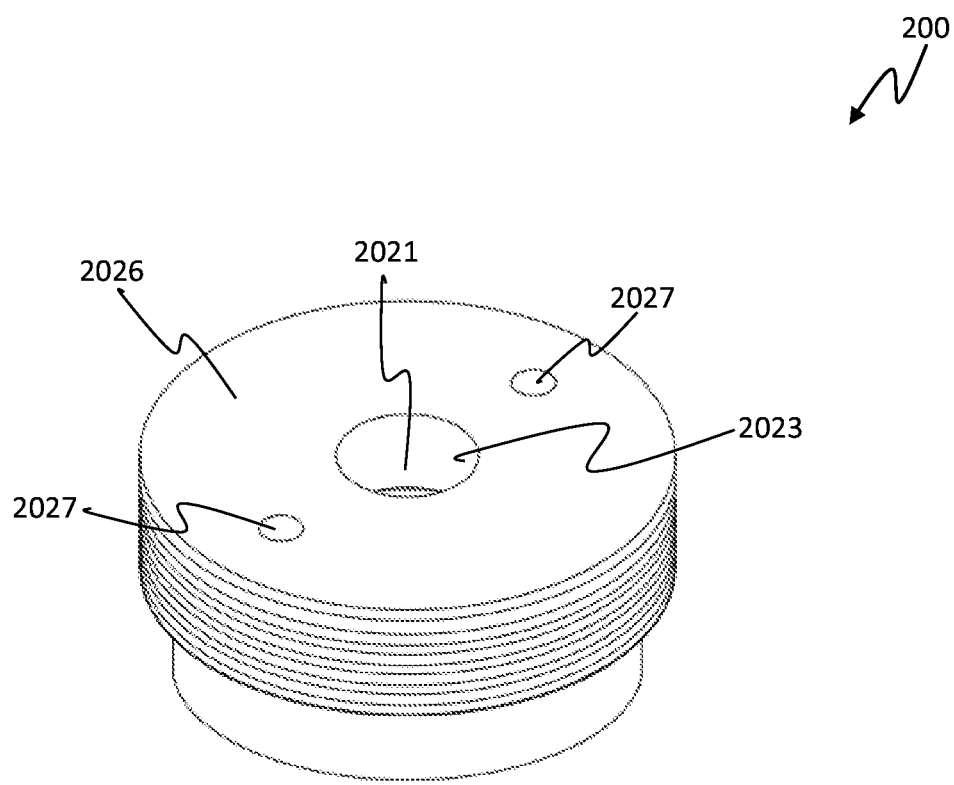
FIG. 3 is a bottom view of the Diode bed of the heat sink mount of the present invention.

The next component of the heat sink mount is a diode bed FIG. 2 at 200. In reference to FIGS. 2 and 3, similarly, the diode bed can be made of any suitable metal or other materials, which have a desired heat transfer coefficient. The diode bed has been formed of two parts, namely a first part 201 and a second part 202. The first part is in a cylindrical shape, whose inside is a second inner hole 2011 that is also in a cylindrical shape concentric to the first part. Accordingly, the first part 201 of the diode bed comprises a second outer side surface 2012 and a second inner side surface 2013, and said second outer side surface and said second inner side surface are concentric. The height of the first part is equal to the height of the diode ring. During the assembling, the diode ring FIG. 1 at 100 will be fitted into the second inner hole of the first part of the diode bed FIG. 2 at 200.

The second part 202 of the diode bed is also in a cylindrical shape. In addition, it also comprises a third inner hole 2021 (FIG. 3) that is in a cylindrical shape, too. The second part comprises a third outer side surface 2022 in FIG. 2 and a third inner side surface 2023 in FIG. 3. After being assembled together, the housing part FIG. 6 at 402 of a laser diode will be fitted into the inner hole of the second part, and the inner side surface of the second part is in contact with the outer side surface of the diode ring at 100 of FIG. 1. Such contact is advantageous to the heat dissipation of the laser diode inside. In addition, the second part also comprises a third height, which is equal to the height of the housing part of a laser diode. Moreover, the second part of diode bed comprises two new features that are not included in the first part of the diode bed. One is a first thread 2025 in FIG. 2, which is located on the outer side surface of the second part. In addition, on the first top surface 2026 in FIG. 3 of the second part, there are two first assembling holes 2027 in FIG. 3, which have been positioned symmetrically on two opposite sides of the third inner hole. This two assembling holes are very useful during the assembling. Two pins of a spanner wrench can perfectly fit into these two assembling holes. Further, said first part, said second part, said second inner hole and said third inner hole are coaxial. Also, each area of said first outer side surface is in contact with said second inner side surface. Each area of said second inner side surface is in contact with said first outer side surface.

Figure 4:
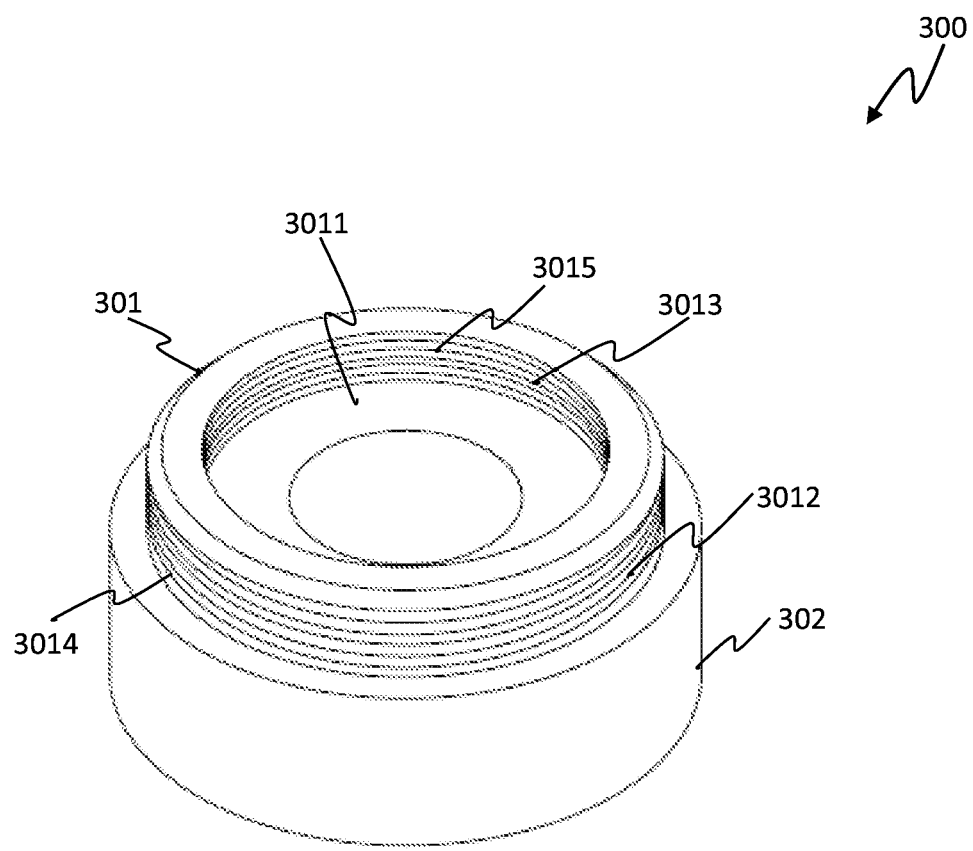
FIG. 4 is a top view of the Diode container of the heat sink mount of the present invention.
Figure 5:
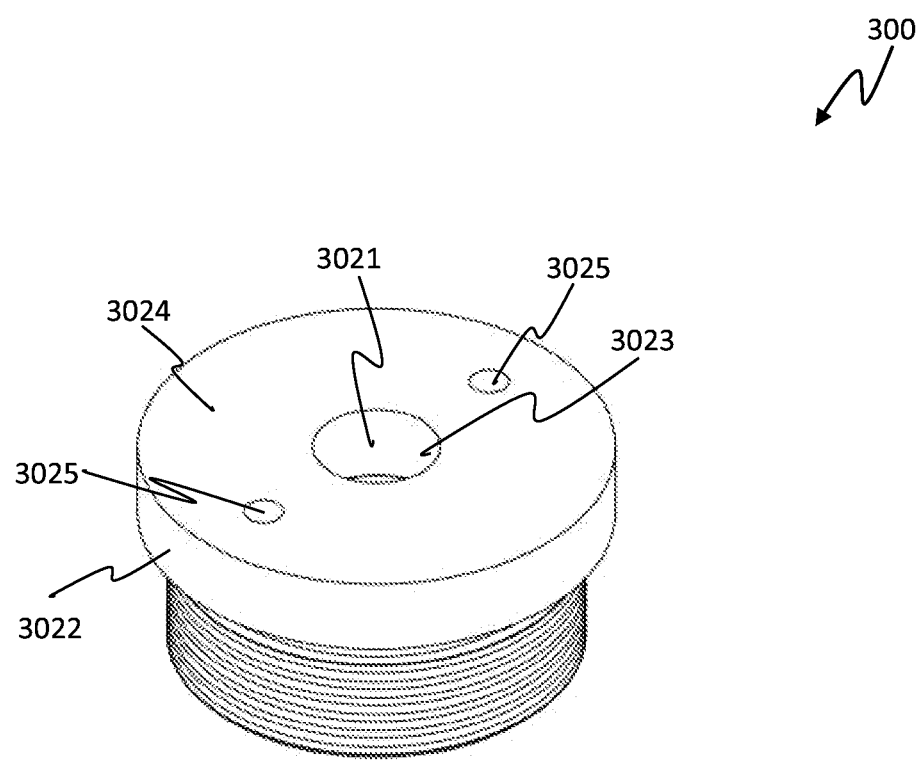
FIG. 5 is a bottom view of the Diode container of the heat sink mount of the present invention.

The last component of the present invention is a diode container FIG. 4 at 300. In regard to its structure, the diode container comprises two parts, namely the part a 301 and the part b 302, please refer to FIGS. 4 and 5 for details. Concerning the part a, it is in a cylindrical shape, and comprises a fourth inner hole 3011 in it. The inner hole and the part a are concentrical. In addition, it also comprises a fourth outer side surface 3012 and a fourth inner side surface 3013. Moreover, both the fourth outer side surface and the fourth inner side surface contain thread. The thread on the fourth outer side surface is designated as the second thread 3014; while the thread on the fourth inner side surface is designated as the third thread 3015. Moreover, the part a has a fourth height, that is equal to the height of the housing part of the laser diode. In this way, the housing part of the laser diode can be completely fitted into the fourth inner hole of the part a of diode container. In addition, the third thread on the fourth inner side surface would be in contact with the first thread located on the third outer side surface of the second part of a diode bed. The part a has a fourth height that is equal to the second height of the first part of diode bed plus the third height of the second part of diode bed.

The part b of the diode container is in a cylindrical shape, too. It comprises a cylindrical shaped fifth inner hole 3021. The fifth inner hole and the part b are concentrical. The part b has a fifth outer side surface 3022 and a fifth inner side surface 3023. After assembling, the electric contact pins FIG. 6 at 403 of the laser diode will be located in the fifth inner hole. In addition, the part b has a second top surface 3024 and two second assembling holes 3025 that have been positioned symmetrically on two opposite sides of the fifth inner hole. These two assembling holes are very useful during the assembling. Two pins of a spanner wrench can perfectly fit into these two assembling holes. The part a, part b, fourth inner hole and fifth inner hole are coaxial.

Furthermore, the heat sink mount of the present invention has a matching assembly tool, which is used for assembling the different components of the heat sink mount together, as well as fitting a laser diode in the center of the heat sink mount. Although the tool is currently not considered as a part of the present invention, but the inventor may pursue a claim for the tool in the future. During the assembling process, the diode bed component of the heat sink mount has been firstly fitted into the central hollow part of the tool, with two small projections on the bottom of the hollow part inserted into the first assembling holes of the diode bed. In this way, the diode bed has been fixed into the tool to facilitate the further assembling steps.

Next, a laser diode is fitted into the fixed diode bed, with its electrical contact pins pointing upward and its housing part inserted into the second part of the diode bed. This ensures that the electrical contact pins for diode are always present in the same position to avoid error in connecting the right leads. Next, the diode ring will be placed outside of the metal stem part of the laser diode, and the first part of diode bed will be located outside of the metal stem. In this way, the first inner side surface of the diode ring will be in contact to the outer side surface of the metal stem part of the laser diode, and at the same time, the first outer side surface of the diode ring will be in contact with the second inner side surface of the first part of ring bed.

Sequentially, the diode container is assembled in, with the electrical contact pins of the laser diode passing through the fifth inner hole of the part b of the diode container. In addition, the entire diode bed, along with the diode ring inside it, will be fitted into the part a of the diode container. The fitting process is analogous to a compression fitting for plumbing and hence provides a very tight mesh for heat sinking. The use of a compression fitting concept which is used for plumbing to prevent water from leaking is now being used for laser heat sinking. The concept of compression fitting for a laser diode is a first of a kind.

Finally, a spanner wrench will be used to screw the components of the heat sink mount together. The two small pins of a spanner wrench are inserted into the two second assembling holes on the part b of diode container. The spanner wrench will be rotated next, so as to screw the first thread on the outer side surface of the second part of diode bed into the third thread on the fourth inner side surface of part a of diode container. In this way, the first thread grips the third thread. Thus, the heat sink mount and the laser diode have been assembled together with the specifically designed tool.

In comparison to the conventional heat sink mount for a laser diode, the heat sink disclosed in the present invention has a few advantages. First, with its particular design, the respective parts of the heat sink mount has been tightly contact with each other via either a metal surface contact or a screw thread grip. In addition, the central diode ring part of the heat sink has a stadium shaped inner hole that can perfectly match the metal stem part of a laser diode. As a result, the air pockets in between different heat sink components and between the laser diode and its heat sink mount have been minimized. Therefore, the heat dissipation effect has been optimized. Through such design, the laser diode has been more efficiently maintained at a stable temperature, which is critical for its proper function.

Second, unlike certain conventional laser diode heat mounts, no glue or other chemical fastening substances has been utilized in the present invention. In this way, it not only saves the related costs, but also avoids the safety concern associated with the chemical glues, which may either lose its stickiness at a higher temperature or evaporate toxic gases that are severely not suitable for many applications of a laser diode, such as being used for human bodies, cosmetic surgery, dental surgery and etc. With eliminating such safety and health concerns, a laser diode mounted to the heat sink disclosed in the present invention could have broader application fields. In addition, glue may cause insulation and hinder heat sinking.

Third, only a very simple screw thread has been involved in the assembling; and no any fastener methods, such as micro-screw or glue, have been involved in the assembling of the present invention. In addition, a specifically designed tool can be used to facilitate the assembling. Accordingly, the assembling efficiency has been greatly improved, which would be further transferred into a lower manufacturing costs, with all the saving from material costs for glue, micro-screw, and the labor or equipment costs for fastening the micro-screw, and applying the glue.

Fourth, the middle part of the heat sink mount disclosed in the present invention, the diode ring, can actually has different forms of its inner hole. In this way, it can be fitted to the laser diode of different types, different designs, and from different manufacturers. This has provided a great potential to choose the laser diode with a desired quality or a desired price, with no concern about the matching of the existing heat sink mount. In addition, when a laser diode is dead, it can be easily removed from the heat sink mount and then replaced with a new one. By using a conventional heat mount that has been glued to a laser diode, there is no way to easily replace the dead laser diode with a new one. Due the cost concerns, in most cases, the entire heat sink mount has to be discarded with the dead laser diode in it, which is not only an unnecessary waste, but also a serious threat to the environment. Nevertheless, with the heat mount disclosed in the present invention, it can not only easily replace the dead laser diode with a new similar one, but also replace the dead laser diode with a different type of laser diode. In such a case, only the tiny diode ring part needs to be replaced with one with a different shaped inner hole, and all other big parts of the heat sink mount can be retained for continuous use.

Although the invention has been explained in relation to its preferred embodiment, it is to be understood that many other possible modifications and variations can be made without departing from the spirit and scope of the invention as herein described.

What is claimed is:

1. A heat sink mount for a laser diode, comprising
a diode ring;
a diode bed;
a diode container; and
said diode ring as a compression fitting to compress a laser diode for mounting.

2. The heat sink mount for a laser diode as set forth in claim 1, comprising
no glue required for connections between said diode ring, said diode bed and said diode container;
no screw or micro-screw required for connections between said diode ring, said diode bed and said diode container;
said diode ring comprising a first inner hole, a first outer side surface, a first inner side surface, and a first height; and
said first inner hole and said diode ring being coaxial.

3. The heat sink mount for a laser diode as set forth in claim 2, comprising
a metal stem part of a laser diode being fitted into said first inner hole;
an outer side surface of said metal stem part being in contact with said first inner side surface; and
said first height being same to a height of said metal stem part.

4. The heat sink mount for a laser diode as set forth in claim 3, wherein
said first inner hole comprises a first cross section; and
said first cross section is in a shape matching a shape of a second cross section of said metal stem part of said laser diode.

5. The heat sink mount for a laser diode as set forth in claim 4, wherein
said first cross section is in a stadium shape.

6. The heat sink mount for a laser diode as set forth in claim 1, wherein said diode bed comprises:
a first part and a second part;
said first part comprising a second inner hole;
said first part comprising a second outer side surface;
said first part comprising a second inner side surface;
said first part comprising a second height;
said second part comprising a third inner hole;
said second part comprising a third outer side surface;
said second part comprising a third inner side surface;
said second part comprising a third height;
said second part comprising a first thread;
said second part comprising a first top surface;
said second part comprising two first assembling holes; and
said first part, said second part, said second inner hole and said third inner hole being coaxial.

7. The heat sink mount for a laser diode as set forth in claim 6, comprising
a housing part of said laser diode being fitted into said third inner hole;
said diode ring being fitted into said second inner hole;
said first height being the same to said second height;
said third height being the same to a height of said housing part;
said first thread being on said third outer side surface;
said two first assembling holes being located on said first top surface; and
said two first assembling holes being symmetrically arranged on two opposite sides of said third inner hole.

8. The heat sink mount for a laser diode as set forth in claim 1, wherein said diode container comprises:
a part a and a part b;
said part a comprising a fourth inner hole;
said part a comprising a fourth outer side surface;
said part a comprising a fourth inner side surface;
said part a comprising a fourth height;
said part a comprising a second thread;
said part a comprising a third thread;
said second thread being on said fourth outer side surface;
said third thread being on said fourth inner surface;
said part b comprising a fifth inner hole;
said part b comprising a fifth outer side surface;
said part b comprising a fifth inner side surface;
said part b comprising a second top surface;
said part b comprising two second assembling holes; and
said part a, said part b, said fourth inner hole and said fifth inner hole being coaxial.

9. The heat sink mount for a laser diode as set forth in claim 8, comprising
   said diode bed being fitted into said fourth inner hole;
   electrical contact pins of said laser diode being passing through said fifth inner hole;
   said third thread being grippingly contacting with said first thread;
   said two second assembling holes being located on said second top surface; and
   said two second assembling holes being symmetrically arranged on two opposite sides of said fifth inner hole.

10. A heat sink mount for a laser diode, comprising
   a diode ring;
   a diode bed;
   a diode container;
   said diode ring as a compression fitting to compress a laser diode for mounting;
   no glue required for connections between said diode ring, said diode bed and said diode container;
   no screw or micro-screw required for connections between said diode ring, said diode bed and said diode container;
   said diode ring comprising a first inner hole, a first outer side surface, a first inner side surface, and a first height; and
   said first inner hole and said diode ring being coaxial.

11. The heat sink mount for a laser diode as set forth in claim 10, comprising
   a metal stem part of a laser diode being fitted into said first inner hole;
   an outer side surface of said metal stem part being in contact with said first inner side surface; and
   said first height being the same to a height of said metal stem part.

12. The heat sink mount for a laser diode as set forth in claim 11, wherein
   said first inner hole comprises a first cross section; and
   said first cross section is in a shape matching a shape of a second cross section of said metal stem part of said laser diode.

13. The heat sink mount for a laser diode as set forth in claim 12, wherein
   said first cross section is in a stadium shape.

14. The heat sink mount for a laser diode as set forth in claim 10, wherein said diode bed comprises:
   a first part and a second part;
   said first part comprising a second inner hole;
   said first part comprising a second outer side surface;
   said first part comprising a second inner side surface;
   said first part comprising a second height;
   said second part comprising a third inner hole;
   said second part comprising a third outer side surface;
   said second part comprising a third inner side surface;
   said second part comprising a third height;
   said second part comprising a first thread;
   said second part comprising a first top surface;
   said second part comprising two first assembling holes; and
   said first part, said second part, said second inner hole and said third inner hole being coaxial.

15. The heat sink mount for a laser diode as set forth in claim 14, comprising
   a housing part of said laser diode being fitted into said third inner hole;
   said diode ring being fitted into said second inner hole;
   said first height being the same to said second height;
   said third height being the same to a height of said housing part;
   said first thread being on said third outer side surface;
   said two first assembling holes being located on said first top surface; and
   said two first assembling holes being symmetrically arranged on two opposite sides of said third inner hole.

16. The heat sink mount for a laser diode as set forth in claim 10, wherein said diode container comprises:
   a part a and a part b;
   said part a comprising a fourth inner hole;
   said part a comprising a fourth outer side surface;
   said part a comprising a fourth inner side surface;
   said part a comprising a fourth height;
   said part a comprising a second thread;
   said part a comprising a third thread;
   said second thread being on said fourth outer side surface;
   said third thread being on said fourth inner surface;
   said part b comprising a fifth inner hole;
   said part b comprising a fifth outer side surface;
   said part b comprising a fifth inner side surface;
   said part b comprising a second top surface;
   said part b comprising two second assembling holes;
   said part a, said part b, said fourth inner hole and said fifth inner hole being coaxial;
   said diode bed being fitted into said fourth inner hole;
   electrical contact pins of said laser diode being passing through said fifth inner hole;
   said third thread being grippingly contacting with said first thread;
   said two second assembling holes being located on said second top surface; and
   said two second assembling holes being symmetrically arranged on two opposite sides of said fifth inner hole.

17. A heat sink mount for a laser diode, comprising
   a diode ring;
   a diode bed;
   a diode container;
   said diode ring as a compression fitting to compress a laser diode for mounting;
   no glue required for connections between said diode ring, said diode bed and said diode container;
   no screw or micro-screw required for connections between said diode ring, said diode bed and said diode container;
   said diode ring comprising a first inner hole, a first outer side surface, a first inner side surface, and a first height;
   said first inner hole and said diode ring being coaxial;
   a metal stem part of a laser diode being fitted into said first inner hole;
   an outer side surface of said metal stem part being in contact with said first inner side surface;
   said first height being the same to a height of said metal stem part;
   said first inner hole comprises a first cross section; and
   said first cross section is in a shape matching a shape of a second cross section of said metal stem part of said laser diode.

18. The heat sink mount for a laser diode as set forth in claim 17, wherein
   said first cross section is in a stadium shape.

19. The heat sink mount for a laser diode as set forth in claim 17, wherein said diode bed comprises:
   a first part and a second part;
   said first part comprising a second inner hole;
   said first part comprising a second outer side surface;
   said first part comprising a second inner side surface;
   said first part comprising a second height;
   said second part comprising a third inner hole;
   said second part comprising a third outer side surface;
   said second part comprising a third inner side surface;
   said second part comprising a third height;
   said second part comprising a first thread;
   said second part comprising a first top surface;
   said second part comprising two first assembling holes;

said first part, said second part, said second inner hole and said third inner hole being coaxial;

a housing part of said laser diode being fitted into said third inner hole;

said diode ring being fitted into said second inner hole;

an outer side surface of said housing part being in contact with said third inner side surface;

each area of said first outer side surface being in contact with said second inner side surface;

each area of said second inner side surface being in contact with said first outer side surface;

said first height being the same to said second height;

said third height being the same to a height of said housing part;

said first thread being on said third outer side surface;

said two first assembling holes being located on said first top surface; and said two first assembling holes being symmetrically arranged on two opposite sides of said third inner hole.

20. The heat sink mount for a laser diode as set forth in claim 17, wherein said diode container comprises:

a part a and a part b;

said part a comprising a fourth inner hole;

said part a comprising a fourth outer side surface;

said part a comprising a fourth inner side surface;

said part a comprising a fourth height;

said part a comprising a second thread;

said part a comprising a third thread;

said second thread being on said fourth outer side surface;

said third thread being on said fourth inner surface;

said part b comprising a fifth inner hole;

said part b comprising a fifth outer side surface;

said part b comprising a fifth inner side surface;

said part b comprising a second top surface;

said part b comprising two second assembling holes;

said part a, said part b, said fourth inner hole and said fifth inner hole being coaxial;

said diode bed being fitted into said fourth inner hole;

electrical contact pins of said laser diode being passing through said fifth inner hole;

said third thread being grippingly contacting with said first thread;

said two second assembling holes being located on said second top surface; and said two second assembling holes being symmetrically arranged on two opposite sides of said fifth inner hole.

* * * * *